United States Patent
Araki (10) Patent No.: US 6,796,439 B2
(45) Date of Patent: Sep. 28, 2004

(54) VERTICAL TYPE WAFER SUPPORTING JIG

(75) Inventor: Itsuo Araki, Kikuchi (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 0 days.

(21) Appl. No.: 10/140,764

(22) Filed: May 8, 2002

(65) Prior Publication Data

US 2002/0187023 A1 Dec. 12, 2002

(30) Foreign Application Priority Data

May 11, 2001 (JP) .................................... 2001-141379

(51) Int. Cl.[7] .............................................. A47G 19/08
(52) U.S. Cl. ................................... 211/41.18; 432/258
(58) Field of Search ................... 211/40, 41.1, 41.18; 206/710–712, 454, 832; 432/258, 259; 414/935

(56) References Cited

U.S. PATENT DOCUMENTS

| | | | | |
|---|---|---|---|---|
| 3,998,333 A | * | 12/1976 | Kamada ................ | 211/41.18 |
| 4,228,902 A | * | 10/1980 | Schulte ................. | 211/41.18 |
| 4,407,654 A | * | 10/1983 | Irwin .................... | 432/258 |
| 5,310,339 A | * | 5/1994 | Ushikawa .............. | 432/253 |
| 5,752,609 A | * | 5/1998 | Kato et al. ............ | 211/41.18 |
| 5,788,088 A | * | 8/1998 | Kao ...................... | 211/40 |
| 5,794,798 A | * | 8/1998 | Kim ...................... | 211/41.18 |
| 5,960,960 A | * | 10/1999 | Yamamoto ............. | 206/711 |
| 6,062,853 A | * | 5/2000 | Shimazu et al. ...... | 432/258 |
| 6,099,302 A | * | 8/2000 | Hong et al. ........... | 432/259 |
| 6,186,344 B1 | * | 2/2001 | Park et al. ............ | 211/41.1 |
| 6,287,112 B1 | * | 9/2001 | Van Voorst Vader et al. ................. | 432/258 |
| 6,378,538 B1 | * | 4/2002 | Brandenburg et al. ...... | 134/201 |
| 6,532,642 B1 | * | 3/2003 | Wingo ................... | 29/558 |

FOREIGN PATENT DOCUMENTS

| | | |
|---|---|---|
| JP | 6-45332 | 6/1994 |
| JP | 9-237781 | 9/1997 |

OTHER PUBLICATIONS

Patent Abstracts of Japan for JP 09–237781.

* cited by examiner

Primary Examiner—Jennifer E. Novosad
(74) Attorney, Agent, or Firm—Andrew L. Tiajoloff; Tiajoloff & Kelly (57) ABSTRACT

In a vertical type wafer supporting jig, a ring-like support plate is fixed to support pillars by a simple structure without conventional welding and without risk of the ring-like support plate falling off. The vertical type wafer supporting jig is configured for mounting many wafers onto many support plates stacked in a vertical direction and fixed to support pillars with a predetermined wafer mounting interval between the support plates. Support groove portions into which the support plates are inserted and supported are formed in the support pillars with a predetermined interval in the vertical direction between them. A fixing rod is provided adjoining at least one of the support pillars. A peripheral part of the support plate has at least one receiving groove corresponding to the fixing rod, and the support plate is fixed to and supported by the support pillars by inserting the support plate into the support groove part, in which it is supported, and fitting the fixing rod into the receiving groove of the support plate.

12 Claims, 7 Drawing Sheets

PRIOR ART

VERTICAL TYPE WAFER SUPPORTING JIG

TECHNICAL FIELD OF THE INVENTION

The present invention relates to a vertical type wafer supporting jig for mounting many wafers onto many support plates stacked superposed on one another with a predetermined wafer mounting interval being provided among them, whereby the support plates are fixed to a plurality of support pillars extending in a vertical direction.

Semiconductor supporting jigs are used for holding many semiconductor wafers aligned, and particularly, vertical type wafer supporting jigs are suitable for a so-called wafer supporting boat for use in transporting wafers into and out of a wafer heat treatment apparatus.

PRIOR ART

In a semiconductor production process in which is used a wafer treatment apparatus for performing drive-in treatment comprising placing semiconductor wafers (which is sometimes referred to simply as "wafers") inside a heating furnace surrounded by a heater, and allowing impurities to permeate inside the wafer by heating under a high temperature atmosphere in a temperature range of from about 400 to 1400° C. while flowing gaseous raw material together with a predetermined carrier gas, conventionally used are cassette boats for supporting the wafers aligned and mother boat or a wafer support boats (supporting jigs) for mounting thereon a plurality of said cassette boats, and these are denoted collectively as wafer supporting jigs.

The wafer supporting jigs are suitable for handling a plurality of thus supported wafers in one unit in each process step, and, in general, processing of the wafers is performed together with the wafer supporting jig, for instance, in the heat treatment step as described above, or in a cleaning step using, for example, hydrofluoric acid as the cleaning liquid. Thus, by taking chemical stability and heat resistance into consideration, generally used as the material for the wafer supporting jigs is quartz glass, silicon, or compounds thereof.

Figure 7:
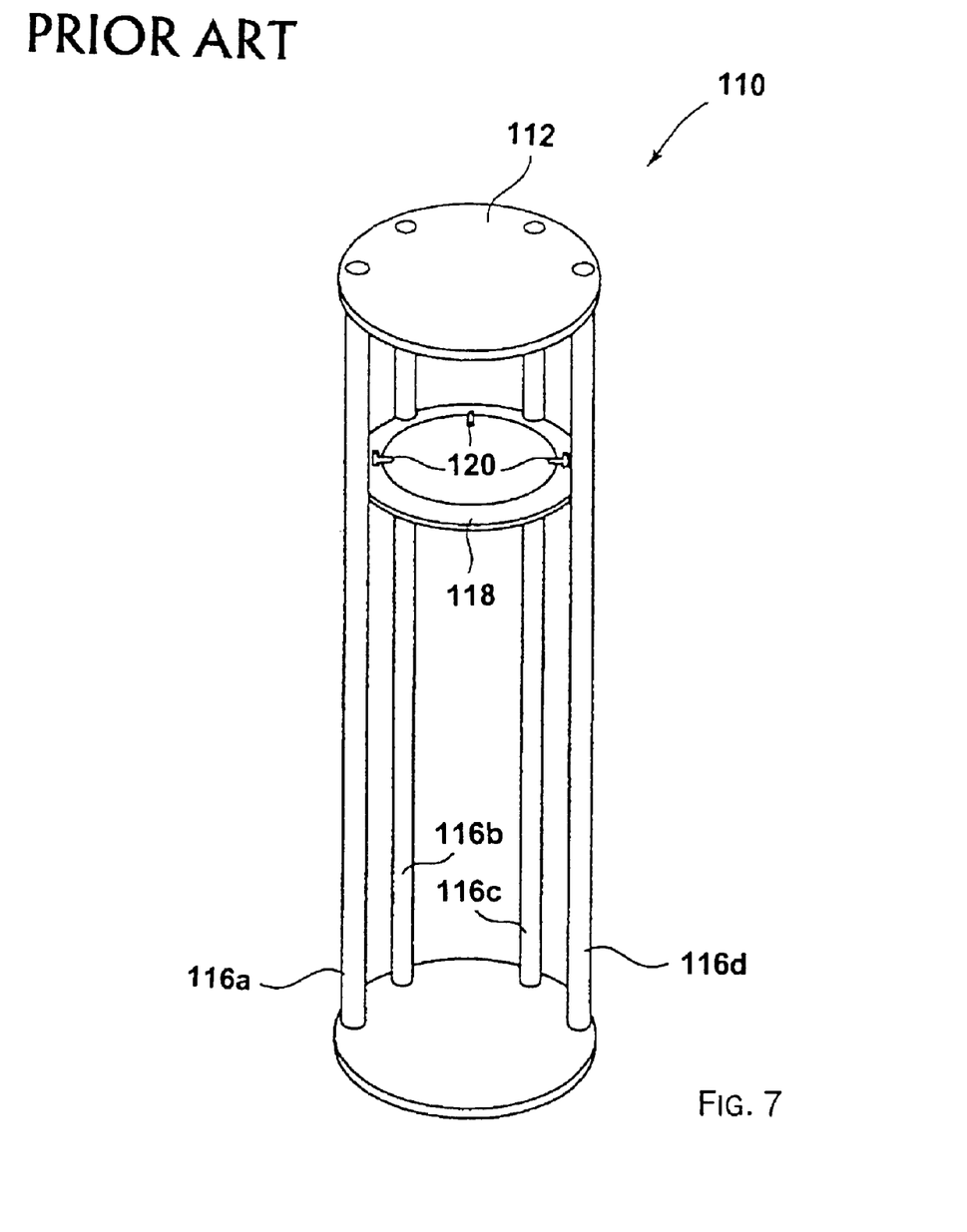
FIG. 7 is a perspective view showing a state that one support plate is welded to a conventional vertical type wafer supporting jig.
Figure 8:
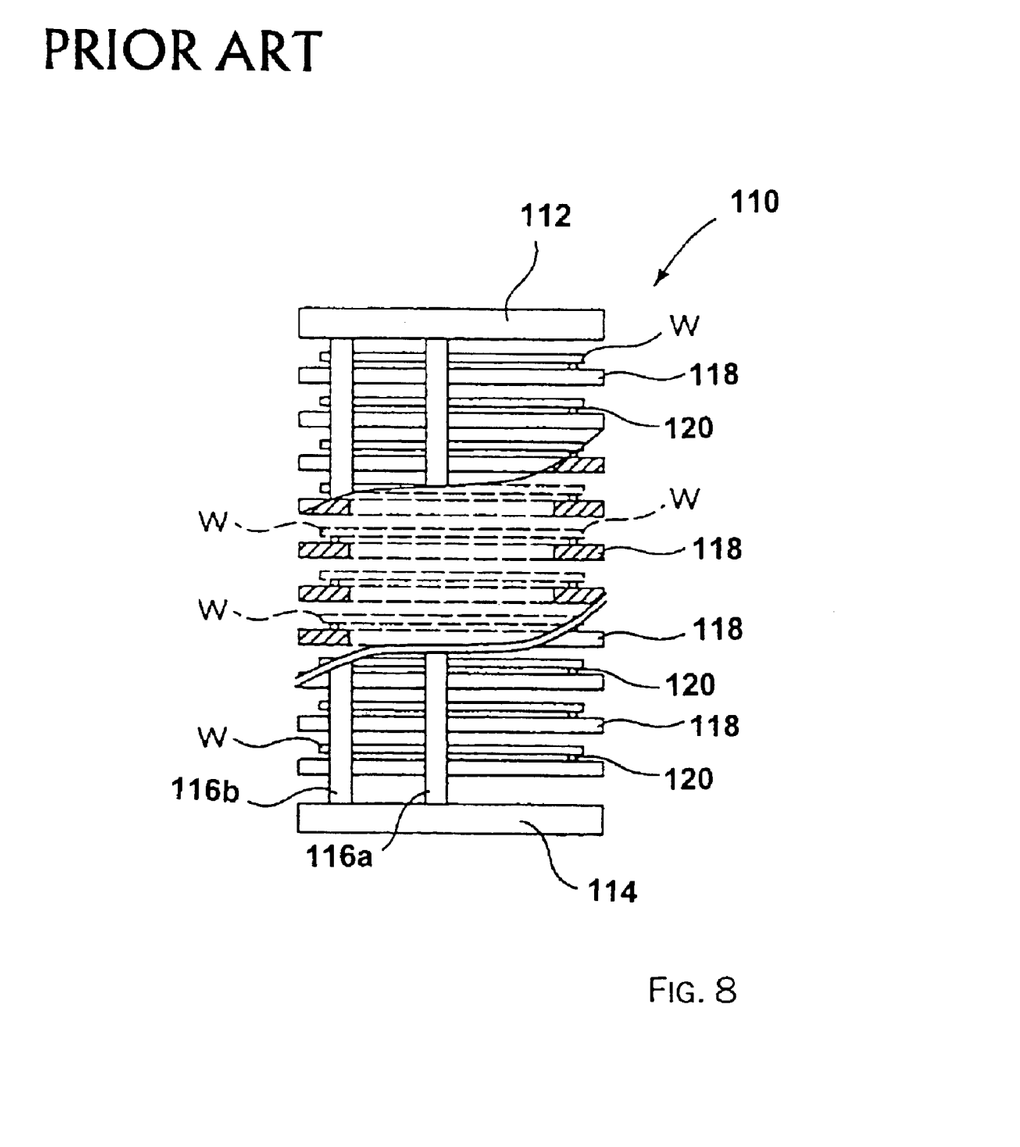
FIG. 8 is a partially cutaway side whole view showing the conventional vertical type wafer supporting jig.

For instance, the vertical type wafer supporting jig 100 shown in FIG. 7 and FIG. 8 comprises a top plate 112 and a bottom plate 114 on the upper and the lower ends thereof, and a plurality (i.e., four, in the example shown in the figure) of support pillars 116a to 116d are attached thereto by welding. A number of ring-like support plates 118 corresponding to the number of the wafers to be placed in the apparatus are attached, by welding, to the plurality of support pillars 116a to 116d arranged in the vertical direction and set apart exactly from each other. A plurality (e.g., 3 pieces) of wafer supporting protrusions are provided on the upper plane of said ring-like supporting plate 118 by taking proper distance from each other, and the wafers W are mounted on the support plate 118 via the wafer supporting protrusions 120.

Problems the Invention is to Solve

However, in producing the vertical type wafer supporting jig 110 of a conventional type, care should be made by taking the size of the wafers W to be handled; for instance, the bottom plate 114 of each of the supporting member inside each of the wafer supporting jig is taken as the standard, and the position set at a distance from the standard plane for attaching each of the supporting plates should be set within the dimensional allowance, or the top plate 112 and the bottom plate 114 should be held within the axial degree allowance, i.e., the allowance in tilting degree with respect to the central axis, etc.

Furthermore, since the wafer supporting jigs 110 in use are handled in units with wafers and are subjected to various types of treatments, they are under danger of suffering from thermal deformation, a change with passage of time due to degradation, melting, wear damage, etc., attributed to the use of cleaning solution on cleaning treatment, or to breakage due to careless operator.

Wafer supporting jigs 110 are made from an expensive material having high chemical stability, and in case even one support plate should require replacement among the many support plates (e.g., 50 wafer support plates per single wafer supporting jig) constituting the unit, the welded old support plates should be cut off and removed by using a cutter and the like, and then a new one should be heated for welding. Such a repair treatment is not easily afforded from technical and economical viewpoint, because it may impair the precision of attachment of the constituting support members around the replaced one.

In particular, the support plates that are used in wafer support jigs frequently subjected to heat treatment tend to cause deformation at higher rates as compared with wafer support jigs used in other processes. In case of a defect attributed not only to a single support member, and requires replacement of plural support plates or repair of the deformed member, the wafer supporting jig should be newly fabricated at a large expense.

Accordingly, the problems of the vertical type wafer supporting jig 110 above are, that there is difficulty in carrying out the welding work while retaining dimensional precision of each member due to the working on fabrication; and, since the support plate 118 is relatively thin with respect to its planar size because the thickness thereof is determined in correspondence with the wafer, that the welding requires high skill because the portions other than the welding position are subject to thermal deformation on welding the support plates to the pillars 116a to 116d. Furthermore, in the repair working, there is fear of causing defects on the surrounding sound support plates 118 on repairing the defective support plate 118 by welding or by thermal treatment. Accordingly, there are other problems as such that a highly skilled technique is required for the repair, that the repair cost becomes costly, etc.

In the light of the aforementioned disadvantages of the prior art technology, there have been proposed a vertical type wafer enclosing jig (Japanese Utility Model Laid-Open No. 45332/1994) or a heat treatment board (unexamined published Japanese patent Laid-Open 237781/1997) employing a non-welding method for fixing the support plates. However, although these proposed methods for fixing the support plates are improved in that they do not use welding, they still had to be simplified in operations for fixing the support plates.

The present invention has been made with an aim to further improve the above methods for fixing the support plates. The present invention provides a vertical type wafer supporting jig which does not employ the conventional welding means for fixing the ring-like support plates to the pillars, which enables fixing the support plates by a simple structure that surely preventing the falling off of the ring-like support plates from occurring, and which also is capable of rapidly cope with the demand of repair.

Means for Solving the Problems

In order to solve the above problems of generic vertical type wafer supporting jig, it is suggested by the present invention that support groove portions for inserting and supporting the support plates are formed in the support pillars with a predetermined interval between them, a fixing rod is provided extending along at least one of the support pillars, whereby in a peripheral part of the support plates at least one receiving groove is provided, said receiving groove is provided to engage the fixing rod, and the support plates are fixed to and supported by the support pillars by means of causing each of the support plates to be inserted into and supported by the support groove portions and causing the fixing rod to be fitted to the at least one receiving groove of each of the support plates.

By using the vertical type wafer supporting jig according to the present invention, there is no need of welding the support plates during the assembly process of the wafer supporting jig as required in the conventional technique, and thereby the wafer supporting jig can be completed by a simple assembly; hence, there is no fear of impairing the dimensional precision or of requiring high skill not only on assemblage but also on repair. In particular, the single support plate that is produced under strict quality control itself assures the quality of the wafer supporting jig. Further, the repair can be completed by a simple exchange of the support plate, the repair can be rapidly accomplished without impairing the other sound support plates, and a repair service of high quality can be provided at a low cost and yet, without impairing the function of the wafer supporting jig.

Preferably, two fixing rods are provided adjacent to two support pillars on the side of inserting the support plates of the plural support pillars above, and by further providing two receiving grooves to the peripheral parts of said support plates in correspondence to said fixing rods in such a manner that said support plates can be inserted to the support groove portions and held thereby and causing the two fixing rods to be fitted to the two receiving grooves of the corresponding support plates so as for the support plate to be fixed to and supported by the support pillars, the inserted support plates can be advantageously supported and fixed surely by the two support pillars.

Mode of Practicing the Present Invention

An embodiment according to the present invention is described below based on the attached FIGS. 1 to 6. However, it should be understood that the case shown in the figures are provided only as examples, and that various modifications can be made thereto so long as they do not deviate from the technical concept of the present invention.

DETAILED DESCRIPTION

A constitution of the wafer supporting jig 10$a$ according to the present invention is basically the same as the prior art constitution shown in FIGS. 7 and 8. Hence, in FIGS. 1 to 6, the members that are the same as or similar to those shown in FIGS. 7 and 8 are described by referring with the same symbols.

The constitution of the vertical type wafer supporting jig 10$a$ according to the present invention is similar to a conventional vertical type wafer supporting jig 10 in that many wafers W are mounted via wafer-support protrusions 20 onto a plurality of ring-like support plates 18 stacked superposed on one another and fixed in a vertical direction to a plurality of support pillars (4 support pillars in the illustrated example) 16$a$ to 16$d$ with a predetermined wafer mounting interval being provided among them.

The key of the vertical type wafer supporting jig 10$a$ according to the present invention is that, differing from the conventional constitution of the ring-like support plates 18 being fixed to the support pillars 16$a$ to 16$d$ by welding, a novel constitution as described hereinafter is employed to fix the support pillars 16$a$ to 16$d$ without employing welding.

Figure 1:
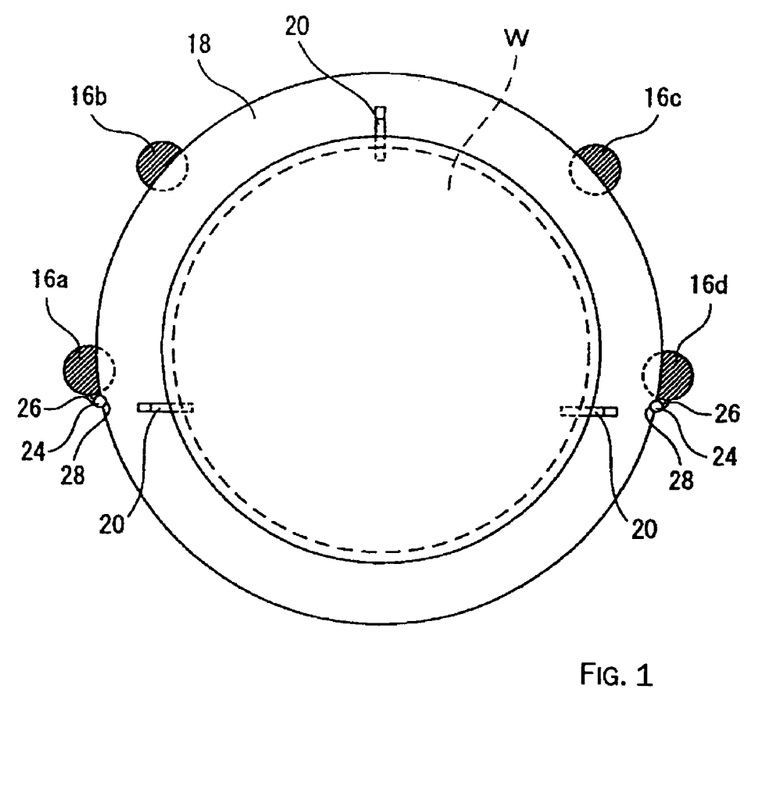
FIG. 1 is a partially sectioned plan view showing a main part of a vertical type wafer supporting jig of the present invention.
Figure 2:
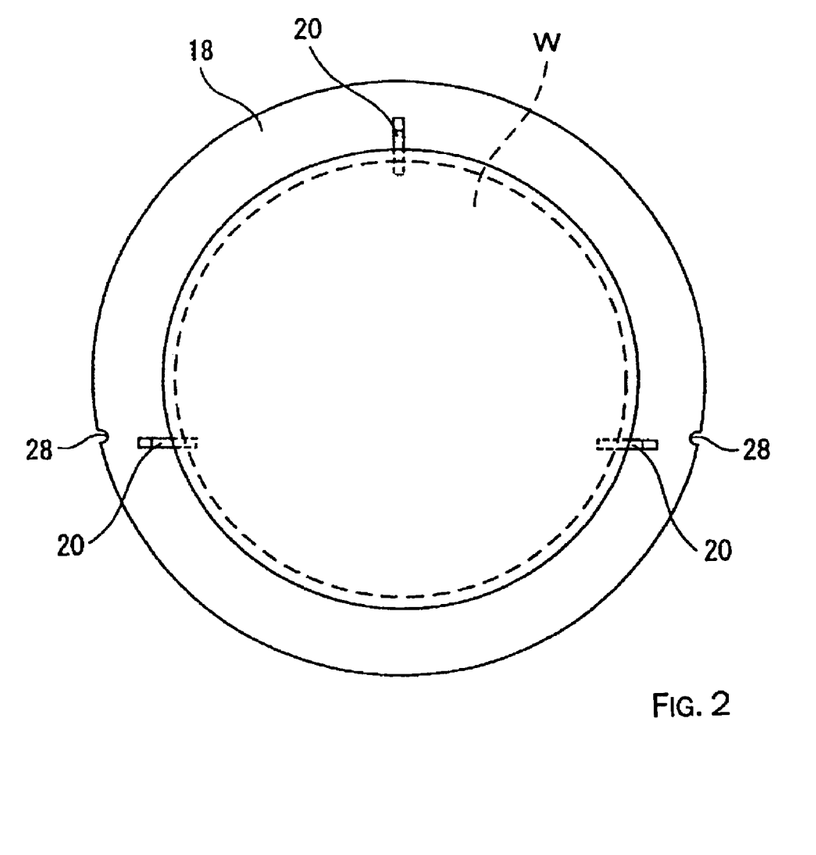
FIG. 2 is a plan view showing a support plate in the vertical type wafer supporting jig of the present invention.
Figure 3:
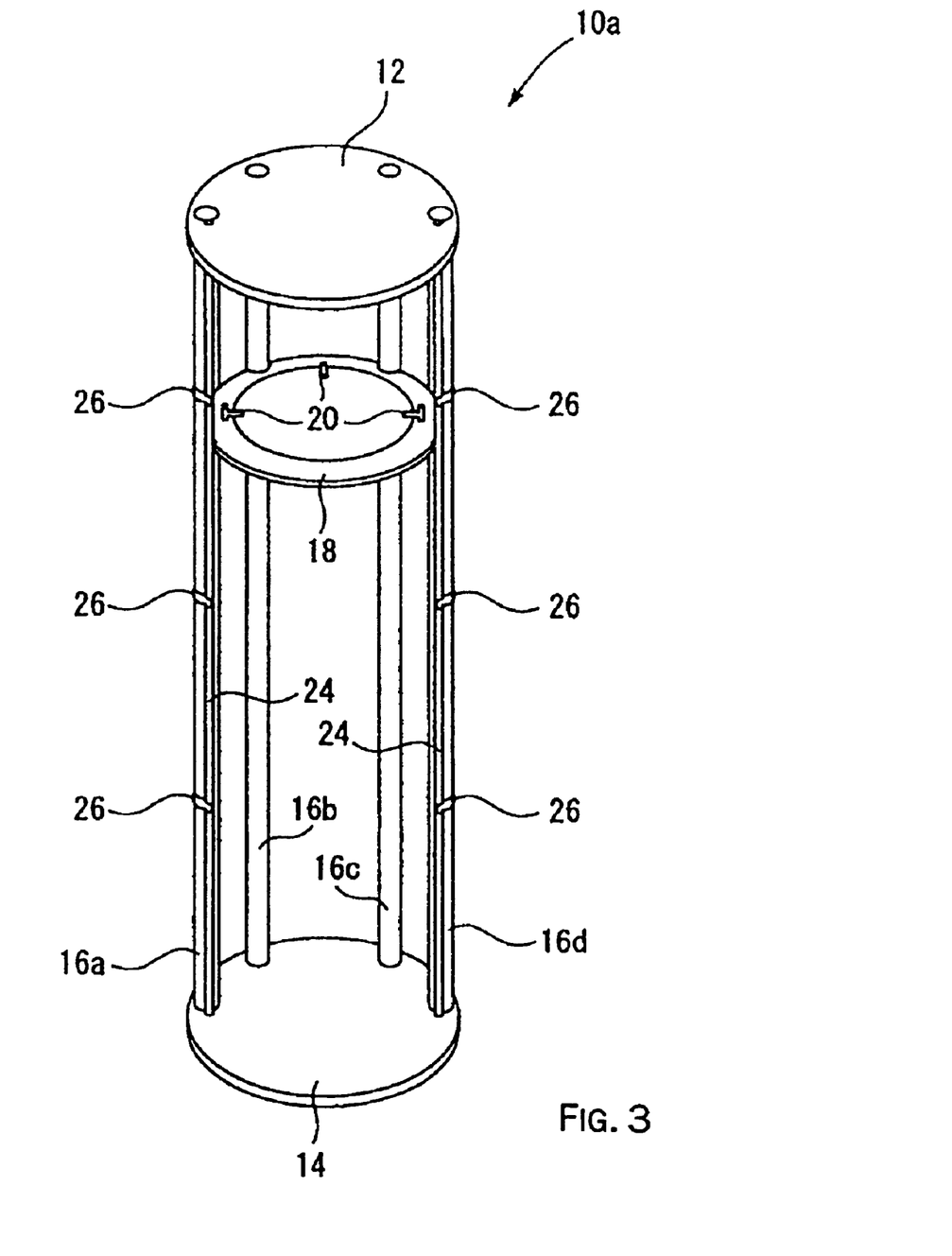
FIG. 3 is a perspective view showing a state that one support plate is inserted and fixed to the vertical type wafer supporting jig of the present invention.
Figure 4:
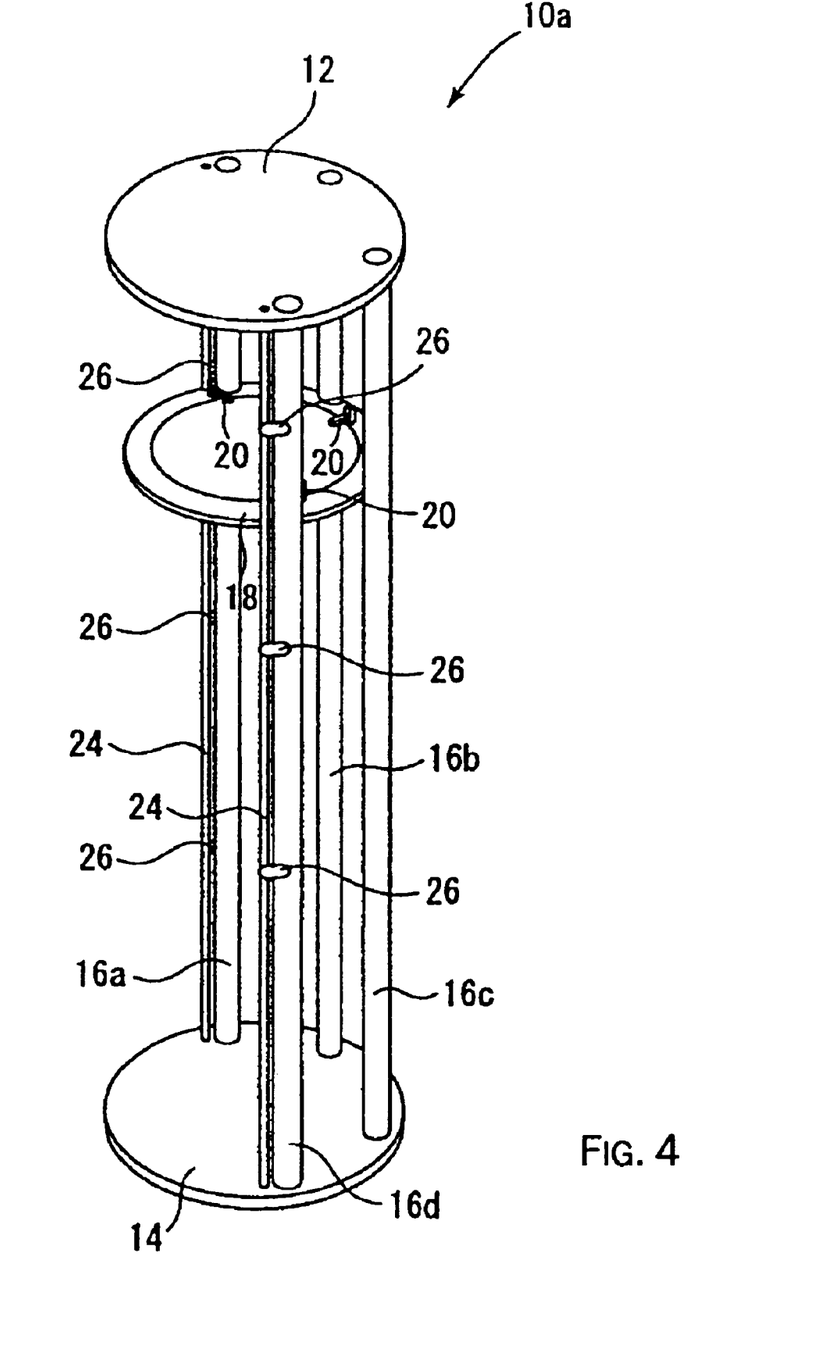
FIG. 4 is a perspective view showing a state that the vertical type wafer supporting jig of the present invention is rotated by 90° from the state of FIG. 3.
Figure 5:
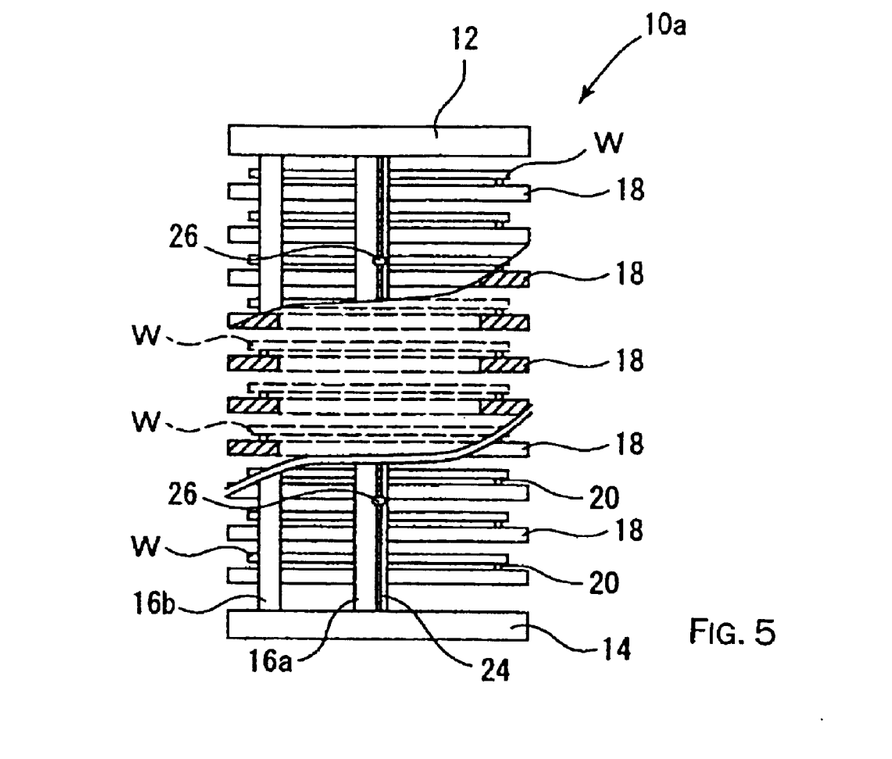
FIG. 5 is a partially cutaway side whole view showing the vertical type wafer supporting jig of the present invention.
Figure 6:
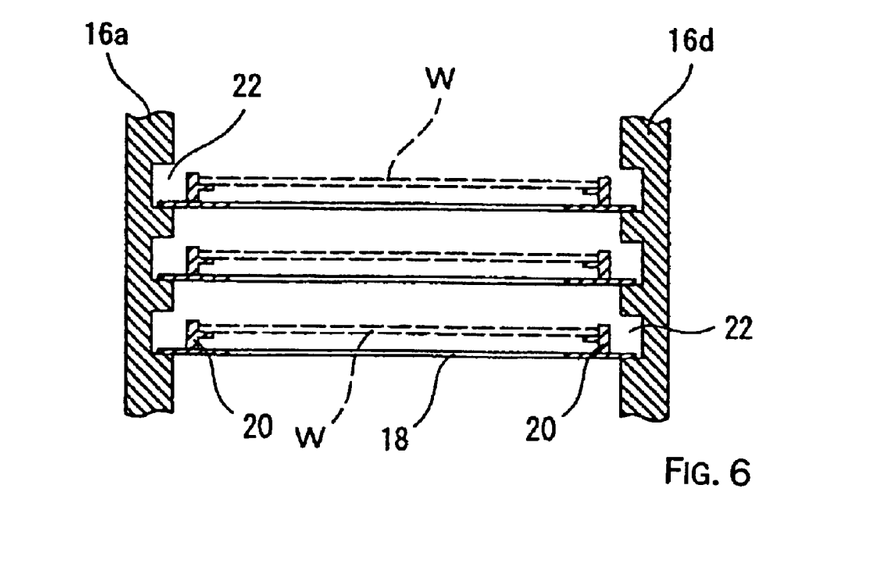
FIG. 6 is a sectional explanatory view showing a main part of the vertical type wafer supporting jig of the present invention.

In the support pillars 16$a$ to 16$d$ of the vertical type wafer supporting jig 10$a$ according to the present invention, support groove portions 22 for inserting and sustaining therein the support plates 18 are perforated with a predetermined interval taken on the upper and the lower directions thereof (FIG. 6). Furthermore, a fixing rod 24 adjacent to at least one of the support pillars 16$a$ to 16$d$ is connected by a means such as welding to the side plane of the support pillars 16$a$ to 16$d$ via a connecting portion 26. The fixing rod 24 is preferably formed into a round rod having a small diameter. The fixing rod 24 is preferably provided in such a manner that fixing rods 24 and 24 are each formed adjacent to two support pillars 16$a$ and 16$d$, respectively, which are, among the support pillars 16$a$ to 16$d$, in the side of inserting the support plate 18.

On the other hand, at least one receiving groove 28 is perforated in the periphery of the ring-like support plate 18 in correspondence with the fixing rod 24. As the receiving groove 28, it is preferred that two receiving grooves 28 and 28 are provided in correspondence with the two fixing rods 24 and 24 described above.

By using such a constitution above, the support plate 18 can be supported and fixed by said support pillars 16$a$ to 16$d$, such that the support plate 18 is inserted and held with the support groove portion 22, while the fixing rods 24 and 24 are fitted in the receiving grooves 28 and 28 of the supporting plate 18. If the support plate 18 should be simply inserted into the support groove portion 22, the support plate 18 remains unstable and would easily fall off, but by fitting the fixing rod 24 into the receiving groove 28 at the same time, the support plate 18 would be firmly fixed to completely eliminate the fear of causing falling off.

Effect of the Invention

As described above, the vertical type wafer supporting jig according to the present invention provides a great effect as such in which a ring-like support plate can be fixed to support pillars by a simple structure without adopting conventional welding means as fixing means and the ring-like support plate can be surely prevented from falling off, and which can rapidly cope with a demand for repair.

Description of the Reference Numerals and Signs

| | |
|---|---|
| 10: | conventional vertical type wafer supporting jig, |
| 10a: | vertical type wafer supporting jig of the present invention, |
| 12: | top plate, |
| 14: | bottom plate, |
| 16a–16d: | support pillar, |
| 18: | ring-like support plate, |
| 20: | wafer supporting protrusion, |
| 22: | support groove portion, |
| 24: | fixing rod, |
| 26: | connecting portion, |
| 28: | receiving groove, |
| W: | wafer. |

What is claimed is:

1. A vertical type wafer supporting jig of quartz glass, the jig comprising:

a plurality of support plates stacked superposed above one another and each being capable of supporting thereon a respective one of a plurality of wafers, said support plates having a predetermined wafer mounting space between adjacent support plates, the support plates being supported without welding on a plurality of support pillars extending in a vertical direction, the support pillars having therein support groove portions receiving and supporting therein the support plates with said predetermined mounting space therebetween, a fixing rod secured in the jig by welding and extending along one of the support pillars, the support plates each having a peripheral part in which a receiving groove is provided, said receiving groove receiving and engaging the fixing rod, and the support plates being secured in engagement with and supported by the support pillars by inserting each of the support plates into respective ones of the support groove portions so as to be supported thereby and placing the fixing rod in the receiving groove of each of the support plates.

2. A vertical type wafer supporting jig as set forth in claim 1, wherein the fixing rod extends adjacent one of the support pillars.

3. A vertical type wafer supporting jig as set forth in claim 1, wherein two of the support pillars define a side of the jig on which each of the support plates is inserted, the fixing rod extending adjacent one of said two support pillars, and a second fixing rod extending adjacent the other of said two support pillars.

4. A vertical type wafer supporting jig as set forth in claim 3, wherein each of the fixing rods is adjoined to the support pillar adjacent the pillar to which it extends.

5. A vertical type wafer supporting jig as set forth in claim 3, wherein the peripheral part of the support plates have second receiving grooves therein receiving and engaging the second fixing rod, the support plates being fixed to and supported by the support pillars by inserting the support plates into the support groove portions so as to be supported therein and placing the two fixing rods in respective receiving grooves of the support plates.

6. A vertical type wafer supporting jig as set forth in claim 1, wherein the support plates are ring-shaped.

7. A vertical type wafer supporting jig of quartz glass the jig comprising:

a plurality of vertically spaced support plates stacked superposed above one another, said support plates having a predetermined wafer mounting space between adjacent support plates, and each of the support plates being configured to support a respective one of a plurality of wafers, the support plates each being fixedly secured to a plurality of support pillars extending in a vertical direction, said support pillars having formed therein support groove portions for receiving and supporting the support plates with said predetermined mounting space therebetween, the support plates each having a peripheral portion having therein first and second receiving grooves, first and second vertically extending fixing rods each being secured in the jig by welding adjacent to and extending along a respective one of said support pillars, said first and second fixing rods each extending within a respective receiving groove in each of the support plates and engaging the support plate therein, and the support plates being fixedly secured in engagement with the support pillars by inserting each of the support plates into a respective one of said groove portions in each of the support pillars, and placing each of the fixing rods in the respective receiving groove of each of the support plates.

8. A vertical type wafer supporting jig as set forth in claim 7, wherein the support plates are ring-shaped.

9. A vertical type wafer supporting jig of quartz glass, the jig comprising:

a plurality of support plates stacked superposed above one another and each being capable of supporting thereon a respective one of a plurality of wafers, said support plates having a predetermined wafer mounting space between adjacent support plates, the support plates being supported without welding on a plurality of support pillars extending in a vertical direction, the support pillars having therein support groove portions receiving and supporting therein the support plates with said predetermined mounting space therebetween, a fixing rod secured in the jig by welding and extending along one of the support pillars, the support plates each having a peripheral part in which a receiving groove is provided, said receiving groove receiving and engaging the fixing rod, and the support plates being secured in engagement with and supported by the support pillars by inserting each of the support plates into respective ones of the support groove portions so as to be supported thereby and placing the fixing rod in the receiving groove of each of the support plates; and wherein the fixing rod is supported on the support pillar and connected therewith by welding.

10. A vertical type wafer supporting jig as set forth in claim 9, wherein the fixing rod is welded to the support pillar via a connecting portion welded to the fixing rod and to the support pillar.

11. A vertical type wafer supporting jig of quartz glass, the jig comprising:

a plurality of vertically spaced support plates stacked superposed above one another, said support plates having a predetermined wafer mounting space between adjacent support plates, and each of the support plates being configured to support a respective one of a plurality of wafers, the support plates each being fixedly secured to a plurality of support pillars extending in a vertical direction, said support pillars having formed therein support groove portions for receiving and supporting the support plates with said predetermined mounting space therebetween, the support plates each having a peripheral portion having therein first and second receiving grooves, first and second vertically extending fixing rods each being secured in the jig by welding adjacent to and extending alone a respective one of said support pillars, said first and second fixing rods each extending within a respective receiving groove in each of the support plates and engaging the support plate therein, and the support plates being fixedly secured in engagement with the support pillars by inserting each of the support plates into a respective one of said groove portions in each of the support pillars, and placing each of the fixing rods in the respective receiving groove of each of the support plates; and wherein the fixing rods are each supported on the respective support pillar and connected therewith by welding.

12. A vertical type wafer supporting jig as set forth in claim 11, wherein the fixing rods are each welded to the respective support pillar via a connecting portion welded to the fixing rod and to the support pillar.

\* \* \* \* \*